United States Patent [19]

Anand et al.

[11] 4,317,686
[45] Mar. 2, 1982

[54] METHOD OF MANUFACTURING FIELD-EFFECT TRANSISTORS BY FORMING DOUBLE INSULATIVE BURIED LAYERS BY ION-IMPLANTATION

[75] Inventors: Kranti V. Anand, Whitstable; John B. Butcher, Hertford Heath, both of England

[73] Assignee: National Research Development Corporation, London, England

[21] Appl. No.: 163,478

[22] Filed: Jun. 27, 1980

[30] Foreign Application Priority Data

Jul. 4, 1979 [GB] United Kingdom ............... 23235/79

[51] Int. Cl.³ .................... H01L 7/54; H01L 21/265
[52] U.S. Cl. .................................. 148/1.5; 148/187; 357/23; 357/49; 357/91
[58] Field of Search ................. 148/1.5, 187; 357/91, 357/49, 23

[56] References Cited

U.S. PATENT DOCUMENTS

| | | | |
|---|---|---|---|
| 3,622,382 | 11/1971 | Brack et al. | 148/1.5 |
| 3,873,373 | 3/1975 | Hill | 148/1.5 |
| 3,897,274 | 7/1975 | Stehlin et al. | 148/1.5 |
| 4,001,049 | 1/1977 | Baglin et al. | 148/1.5 |
| 4,105,805 | 8/1978 | Glendinning et al. | 427/38 |
| 4,133,704 | 1/1979 | McIver et al. | 148/1.5 |

*Primary Examiner*—Upendra Roy
*Attorney, Agent, or Firm*—Cushman, Darby & Cushman

[57] ABSTRACT

A method of making a field-effect transistor is described in which first and second insulating layers are formed in crystalline material by ion implantation and, if necessary, annealing, further crystalline material being grown, if necessary, after the first layer has been implanted. Source and drain regions are defined in the material between the first and second layers, a layer of protective oxide is formed and metallization to form contacts for a gate region and the source and drain regions is deposited. Field-effect transistors made by the method are described and circuits containing such transistors can be separated by etching down to the first layer or by regions of amorphous material.

7 Claims, 10 Drawing Figures

METHOD OF MANUFACTURING FIELD-EFFECT TRANSISTORS BY FORMING DOUBLE INSULATIVE BURIED LAYERS BY ION-IMPLANTATION

BACKGROUND OF THE INVENTION

The present invention relates to a method of constructing field-effect transistors (FETs), particularly but not exclusively, metal oxide semiconductor transistors (MOSTs) which can be constructed as either single polarity devices or as complementary devices (CMOS) to operate in high performance integrated circuits or as discrete devices.

A type of MOST which has many advantages is one in which the source and drain regions and the region separating the source and drain regions are formed in silicon deposited on sapphire, this structure being known as silicon on sapphire (SOS) (See "Sapphire Brings Out the Best in CMOS" by S. Sheffield Eaton, Electronics, June 12th 1975, page 115). However, such devices are expensive to manufacture since sapphire is required as a starting material and suffer from the disadvantage that high leakage currents flow between the source and drain because of crystal distortion at the interface where during manufacture silicon is grown on a sapphire crystal.

SUMMARY OF THE INVENTION

According to a first aspect of the present invention there is provided a method of constructing a field-effect transistor comprising implanting ions in crystalline semiconductor material to form a relatively high ion-concentration layer buried in the semiconductor material, the ions being either of a first type which disrupts the crystal structure of the semiconductor material to form an amorphous first insulating layer, or of a second type which is capable of forming an insulating compound with the semiconductor material, the method then including annealing the semiconductor material to form the first insulating layer by reacting the ions with the semiconductor material, implanting further ions in the semiconductor material to form a further relatively high ion concentration layer buried in the semiconductor material between the surface thereof and the first insulating layer, the ions being of either a third type which disrupts the crystal structure of the semiconductor material to form an amorphous second insulating layer, or of a fourth type which is capable of forming an insulating compound with the semiconductor material, the method then including annealing the semiconductor material to form the second insulating layer by reacting the further ions with semiconductor material, forming source and drain regions in the semiconductor material between the two insulating layers, defining a gate region and a gate insulation region in the semiconductor material above the second insulating layer and in the second insulating layer, respectively, and forming both a protective layer and metallisation for electrical connections.

If the thickness of semiconductor material above the first insulating layer is insufficient to accommodate the drain, source, gate insulation and gate of a field-effect transistor, a layer of the same or a different crystalline semiconductor material is formed on that surface adjacent to the first insulating layer, before the implantation of ions in forming the second insulating layer. The layer of crystalline semiconductor material, formed before the second ion implantation step, is preferably grown epitaxially.

Either the third type of ion is preferably the same as the first type, or the fourth type is preferably the same as the second type, but alternatively one insulating compound and one amorphous region may be employed.

Where annealing is required to form both the first and second layers both annealing operations may, in some circumstances, be carried out at the same time.

According to a second aspect of the present invention there is provided a field-effect transistor comprising a crystalline semiconductor substrate, a first insulating layer buried in the substrate, source and drain regions formed between a surface of the transistor and the first insulating layer, the source and drain regions being separated by a region which is of different conductivity from the source and drain regions, a second insulating layer buried beneath a gate region for the transistor, but above the region separating the source and drain regions, a protective layer of insulating material formed over the source, gate and drain regions with apertures for connections to these three regions, and metallisation forming the said connections, the first and second insulating layers having been formed either by implanting ions which form an insulating compound of the semiconductor material and annealing to form the compound, or by implanting ions which disrupt the crystalline semiconductor material to provide the insulating layers in the form of amorphous semiconductor material.

In both first and second aspects of the invention the semiconductor is usually silicon but other semiconductors such as germanium and gallium arsenide may be used.

The region separating the source and drain regions is of the opposite conductivity type to the source and drain regions in an enhancement FET but of the same type in a depletion FET.

Isolation between devices on the same substrate is provided by the first insulating layer and around the device either by conventional means such as a back biassed PN junction; or preferably by "air" isolation achieved by photo-engraving or alternatively by a wall of amorphous semiconductor material formed by ion implantation.

Usually the ions implanted to form the insulating layers are oxygen or nitrogen ions so that where the semiconductor material is silicon, the insulating compound is silicon dioxide or silicon nitride. If the insulating layer or region is formed by amorphous silicon the ions used to disrupt crystal structure may, for example, be neon ions.

The insulating layers may each be formed by an insulating compound or by amorphous silicon. Where both the layers are formed by compounds, the compounds may be the same or different, and where both are amorphous the type of ion used to disrupt the crystal structure may be the same or different.

In the method and apparatus of the invention the substrate is either N or P type with the region between the source and drain regions doped during production to produce the required type of FET.

The dose implantations required to form the first and second insulating layers are very heavy in comparison with those required for doping to form source and drain regions, as can be seen from the specific examples given later.

An advantage of the present invention is that the gate silicon is monocrystalline giving lower resistivity than the polycrystalline silicon gate formed in the usual silicon gate process. This results in superior properties for example in relation to switching time.

The silicon gate process mentioned above suffers from the further disadvantage that the chemical processes associated therewith contaminate the gate oxide with mobile ions such as potassium and sodium ions which are detrimental to the stable operation of the FET. In order to reduce this effect phosphorus stabilisation is used but the resulting phosphorus doped glass (that is silicon dioxide) is difficult to photo-engrave. In the present invention since the oxide is buried below the top surface during chemical processing the mobile ions do not contaminate the gate oxide. Hence yield is improved and the resulting device is of higher stability since ionic contamination has been largely eliminated.

The present invention does not suffer from disadvantages in relation to the silicon gate process since the total number of photo-engraving steps required in both processes is four. Further, the gate is "auto-registered" by a non-critical photo-engraving process as in the silicon gate process. "Auto-registration" means that when the gate oxide is defined during photo-engraving, "windows", for doping the source and drain regions, are laid down at the same time so that the source and drain regions automatically "register" with the gate oxide.

Since the present invention can be applied to either enhancement or depletion FETs (including deep depletion FETs) and each device is isolated from the substrate by means of the insulating layer, CMOS devices of superior performance can be constructed on the same substrate. Briefly, an enhancement FET is so constructed that the source and drain regions (both of same polarity) are separated by a region of opposite polarity. In a depletion FET, the source and drain regions (again of same polarity) are separated by a region of same polarity but of higher resistivity. In the present invention, due to the isolation layer below the device, a deep depletion FET (see the above mentioned paper by Sheffield Eaton) can be constructed on the same polarity type of silicon layer as the enhancement MOST thereby simplifying the process very considerably. However, the threshold voltage of this deep depletion MOST is of opposite sign to that of the enhancement MOST which gives a complementary operation sometimes called pseudo complementary mode. However, the method of the invention may be used to produce true CMOS N and P enhancement devices, and devices according to the invention include true 'CMOS' enhancement devices.

A further major advantage of field-effect transistors according to the present invention is that a device having the advantages of an SOS structure is produced without the strained or polycrystalline structure leading to high leakage currents which occurs in SOS devices. The source and drain regions and the region separating the source and drain regions are formed in the present device in silicon which is part of the original crystal structure which was present before the insulating layer was formed by ion implantation and, usually, annealing. It is this insulating layer which is equivalent to the sapphire layer and there is no strained crystal structure between this layer and the silicon above it. Hence leakage current is much reduced allowing dynamic logic circuits to be produced. As has been mentioned, more silicon is grown on the silicon layer above the insulating layer in order to make it thick enough to accommodate the source and drain regions, the gate insulation and the gate region but since silicon is then grown on silicon a monocrystalline structure can be achieved without a strained crystal structure.

Where air isolation is used, the invention allows high density of circuits since no guard ring of the type usually required in conventional bulk CMOS is needed. High yields are possible since when using air isolation a 'mesa island' is formed in which the active device is made, the quality of the buried dielectric layer is therefore non-critical outside the island.

High speed devices can be produced since nodal capacitance is low (due to dielectric isolation and auto-registration of the gate), the threshold voltage is low and complementary operation is possible.

Sidewall isolation with amorphous material prevents 'spurious' or phantom MOSTs appearing and leads to simpler design, and the small step height in the metallisation with this type of isolation improves yield.

More flexible design techniques are possible since four conductive layers exist in the device and this is important for interconnection in Very Large Scale Integration (VLSI) devices.

BRIEF DESCRIPTION OF THE DRAWINGS

Certain embodiments of the invention will now be described by way of example with reference to the accompanying drawings, in which.

DETAILED DESCRIPTION OF THE PREFERRED EMBODIMENTS

The steps in the construction of an N channel enhancement MOST according to one embodiment of the invention will now be described. A P type silicon substrate is first subjected to ion implantation using known apparatus such as that described in "Electronic Engineering" for December 1977, pages 43 to 47. In this example oxygen ions are used but other ions such as nitrogen may be used as an alternative. High dosages of about $1.2 \times 10^{18}$ cm$^{-2}$ molecular oxygen ions were implanted at an energy of 400 keV, that is effectively 200 keV for atomic oxygen with a substrate orientation of <111>.

Figure 1:
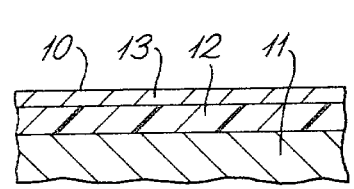
FIG. 1 is a cross-section of a portion of a silicon substrate after the formation of a buried oxide layer by ion implantation and annealing.

The result of the ion implantation procedure is a Gaussian distribution of concentration of oxygen ions with distance from the substrate surface which reaches a peak concentration at about 0.30 to 0.80 microns from the top surface 10 of the silicon substrate 11 (see FIG. 1).

The next stage in construction is the annealing of the substrate and this results in a layer 12 of silicon dioxide being formed where the implanted oxygen ions combine with the silicon. Although the Gaussian distribution extends above and below the layer 12, it is only within this layer that practically all silicon atoms are converted to silicon dioxide and thus an insulating layer about 0.3 to 0.5 microns in thickness is formed. Outside the layer 12 the silicon can be regarded as remaining unchanged.

Annealing is carried out at 1100° C. for a minimum of fifteen minutes in oxygen-free and dry hydrogen which is prepared by passing hydrogen through palladium catalyst and a molecular sieve.

In addition to forming the silicon dioxide, annealing repairs the monocrystalline structure of the silicon layer 13 above the layer 12 in FIG. 1 where it is damaged due to ion bombardment.

Figure 2:
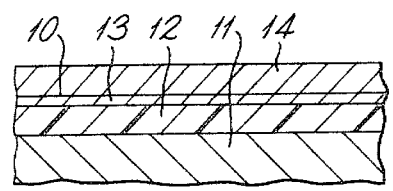
FIG. 2 is a cross-section of the substrate portion of FIG. 1 after a further silicon layer has been grown on the upper surface.

Since the layer 13 is usually too thin (about 0.1 microns) for the construction of the gate, the drain and the source of an MOST, an epitaxial monocrystalline silicon layer 14 1 to 5 microns in thickness is grown on the surface 10 (see FIG. 2) in a conventional way, such as is described in the "Microelectronics Journal", Volume 9, No. 2, 1978, pages 8 to 12. Substrates with the structure shown in FIG. 1 are placed in a horizontal chemical vapour deposition (CVD) reactor and heated to 1100° C., silane gas then being passed over the substrate. This process can be combined with the previous annealing which may be carried out in the CVD before the silane is introduced.

With higher implant energies the insulating layer 12 can be more deeply buried, and the epitaxial growth of further silicon as described in the preceding paragraph is not required.

Figure 3:
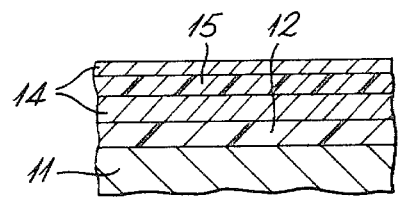
FIG. 3 is a view of the substrate portion of FIG. 2 after a further oxide layer has been buried by ion implantation and annealing.

A further stage of ion implantation, again using oxygen ions but using the lower energies and dosage as for the layer 12, is now carried out so that a region of high concentration of oxygen ions is implanted into the layer 14 (which is shown in FIG. 3 as including the layer 13). An energy of about 50 keV with a dose of $5 \times 10^{17} cm^{-2}$ of oxygen ions is expected to be suitable. Another stage of annealing for one hour at 1100° C. in nitrogen is carried out, using the same conditions as for the layer 12, and as a result another silicon oxide layer 15 about 0.1 microns thick is formed in the layer 14.

Figure 4:
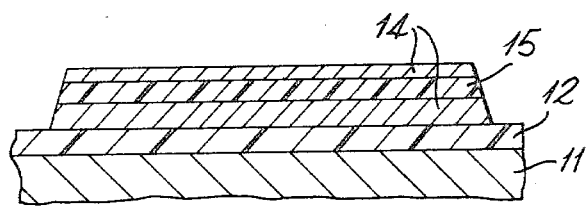
FIGS. 4 and 5 show two stages in photo-engraving a substrate portion of FIG. 3 to define gate and gate oxide regions.
Figure 5:
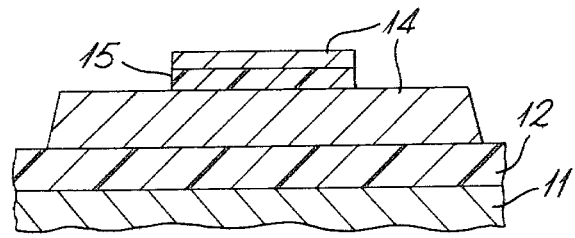
Figure 6:
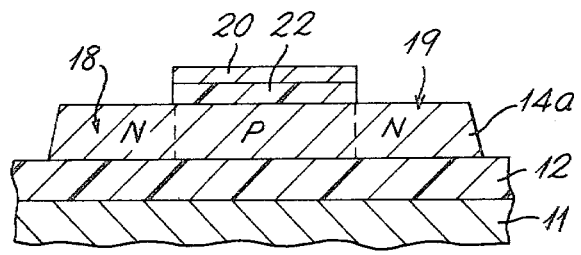
FIG. 6 shows the substrate of FIG. 4 after doping to provide source and drain regions.

The device shown in FIG. 3 is now photo-engraved using known techniques to remove parts of layers 14 and 15 and provide the "mesa" structure shown in FIG. 4. This structure gives "air" isolation to the device when finished. A further photo-engraving step defines the gate region and the gate oxide by removing parts of the upper layer 14 and the oxide layer 15, with the resulting outline shown in FIG. 5. Again using known techniques, regions 18 and 19 (see FIG. 6) are doped to form N+ source and drain regions, respectively. At the same time the portion 20 of the layer 14 also becomes N+ doped and forms the gate electrode for the MOST under construction. Hence the region 22 of the layer 15 forms the insulating gate oxide for the gate 20.

A useful description of the techniques used in integrated circuit processing is given in the book by E. R. Hnatek "A User's Handbook of Integrated Circuits" published by John Wiley & Sons.

A protective layer 23 (see FIG. 7) of silicon dioxide is now grown over the upper surface of the whole device shown in FIG. 4 using the known silox process which is described by W. Kerin and R. C. Heim, Journal of the Electrochemical Society, Vol. 117, p. 562, 1970. After the growth of the layer 23 further photo-engraving provides wells 24, 25 and 26 which extend to the source, gate and drain regions respectively. Metallisation is then added in a required pattern to form interconnections between various devices on the same substrate. This metallisation is indicated by way of example using the designation 27.

Figure 7:
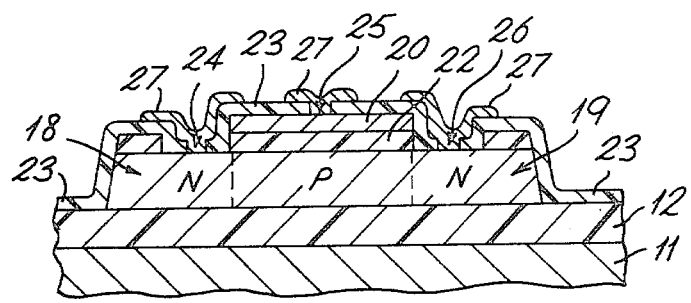
FIG. 7 shows a cross-section of an MOST formed by the steps illustrated in FIGS. 1 to 6.

The complete MOST is shown in section in FIG. 7; it has the source region 18 and the drain region 19 separated by a P type silicon region, with these regions isolated from the substrate 11 by the insulating layer 12. The gate region 20 is insulated by the gate oxide region 22.

Figure 8:
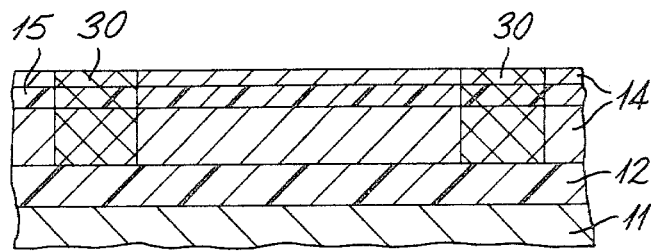
FIG. 8 shows the substrate of FIG. 3 after the implantation of an amorphous isolating region, in an alternative structure.

In an alternative method of isolating devices, ion implantation using, for example, neon or xenon ions is used to form an amorphous region 30 (see FIG. 8) surrounding those parts of the layers 14 and 15 which are to form the gate, source and drain of the device. This implantation is carried out when the region 15 has been produced, that is the device has reached the stage shown in FIG. 3. For neon a dose of about $1 \times 10^{15} cm^{-2}$ at a typical maximum energy of about 300 keV is expected to be suitable for forming the region 30.

Figure 9:
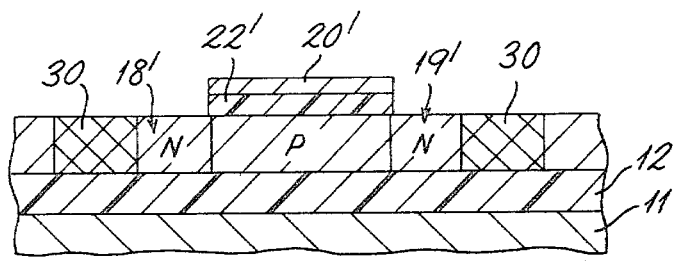
FIG. 9 shows the substrate of FIG. 8 after photo-engraving to define gate and gate oxide regions, and doping to form source and drain regions.

Photo-engraving followed by doping defines a gate region 20′, gate oxide 22′, a source region 18′ and a drain region 19′, as shown in FIG. 9.

Figure 10:
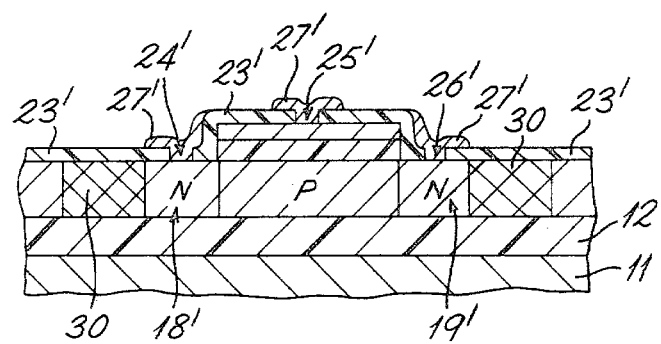
FIG. 10 shows the cross-section of an MOST formed by the steps illustrated in FIGS. 1 to 3 and FIGS. 8 and 9.

The completed device (see FIG. 10) is realized after growing a thick protective layer 23′ of silicon dioxide, photo-engraving to provide wells 24′, 25′ and 26′, and metallising to form contacts 27′.

While two embodiments of the invention have been specifically described it will be clear from other possibilities mentioned in more general terms that FETs according to the invention may be constructed in other ways, have different structures and be formed from different materials. In particular if N type silicon is used as the starting substrate, enhancement P MOSTs can be made, or both enhancement and deep depletion types (for pseudo complementary operation) can be made on the same substrate if doping is used to provide the required relatively positive and negative conduction regions. Alternatively, enhancement N and P type devices, for true complementary operation, can be made on the same substrate using two separate epitaxial process stages to produce layers of opposite conductivity types in which the two FETs are created.

We claim:

1. A method for constructing a field-effect transistor comprising the steps of:
   (a) implanting ions in a body of crystalline semiconductor material to form a first relatively high ion-concentration layer buried in the semiconductor material adjacent to a surface of the body, the ions being of a type which is at least capable of making the first layer an insulating layer;
   (b) forming a layer of crystalline semiconductor material on the said surface resulting in a new surface for a portion of the body;

(c) implanting further ions in the semiconductor material to form a second relatively high ion-concentration layer buried in the semiconductor material between the new surface and the first high ion-concentration layer, the further ions being of a type which is at least capable of making the second layer an insulating layer;

(d) forming source and drain regions in the semiconductor material between the first and second high ion-concentration layers;

(e) defining a gate region and a gate insulation region in the semiconductor material between the new surface and the second high ion-concentration layer and in the said second layer, respectively, and thereafter (f) forming both a protective layer for the transistor and metallisation for electrical connections.

2. A method according to claim 1 wherein the ions implanted to form the first high ion-concentration layer form an amorphous insulating layer on implantation.

3. A method according to claim 1 wherein the ions implanted to form at least one of the first and second high ion-concentration layers are capable of forming an insulating compound with the semiconductor material, including the step of annealing the semiconductor material after implanting ions to form the said one layer, the said insulating compound being formed on annealing.

4. A method according to claim 1 wherein the ions implanted to form the first and second layers are capable of reacting with the semiconductor material to form insulation, including the step of annealing the semiconductor material after implanting ions so making the first and second layers insulating.

5. A method according to claim 1 wherein the ions implanted in step (c) form the second layer are oxygen ions.

6. A method according to claim 1 wherein the ions implanted to form the first layer are the same as those implanted to form the second layer.

7. A method according to claim 4 wherein the semiconductor is annealed twice, firstly, after implanting ions to form the first layer, but before ions are implanted to form the second layer and secondly after implanting ions to form the second layer.

* * * * *